(12) United States Patent
Sung (10) Patent No.: US 11,294,288 B2
(45) Date of Patent: Apr. 5, 2022

(54) EXPOSURE DEVICE, EXPOSURE METHOD AND PHOTOLITHOGRAPHY METHOD

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventor: Moon Gyu Sung, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

(*) Notice: Subject to any disclaimer, the term of this patent is extended or adjusted under 35 U.S.C. 154(b) by 717 days.

(21) Appl. No.: 16/090,740

(22) PCT Filed: Mar. 28, 2018

(86) PCT No.: PCT/CN2018/080768
§ 371 (c)(1),
(2) Date: Oct. 2, 2018

(87) PCT Pub. No.: WO2019/041796
PCT Pub. Date: Mar. 7, 2019

(65) Prior Publication Data
US 2021/0216018 A1 Jul. 15, 2021

(30) Foreign Application Priority Data
Aug. 31, 2017 (CN) .......................... 201710770859.4

(51) Int. Cl.
*G03F 7/20* (2006.01)

(52) U.S. Cl.
CPC .................................. *G03F 7/7015* (2013.01)

(58) Field of Classification Search
CPC ............... G03F 7/7015; G03F 7/70041; G03F 7/70283; G03F 7/70291; G03F 7/704;
(Continued)

(56) References Cited

U.S. PATENT DOCUMENTS 6,687,041 B1 * 2/2004 Sandstrom .......... B23K 26/064
359/291
8,137,870 B2 3/2012 Lee et al.
(Continued)

FOREIGN PATENT DOCUMENTS

| CN | 1292102 A | 4/2001 |
| CN | 2795900 Y | 7/2006 |

(Continued)

OTHER PUBLICATIONS

Machine Translation of Fujisawa et al., JP 10032160, 02-1998.*
(Continued)

*Primary Examiner* — Peter B Kim (57) ABSTRACT

An exposure device, an exposure method and a photolithography method are provided. The exposure device includes an exposure light source and an optical-path assembly, the optical-path assembly is configured to guide light emitted by the exposure light source to an exposing position, the optical-path assembly includes a light valve array, the light emitted by the exposure light source is able to be guided to the light valve array and then guided to the exposing position after the light is transmitted or reflected by the light valve array, the light valve array includes a plurality of light valve units, and optical transmittance or reflectivity of each of the light valve units is adjustable.

18 Claims, 7 Drawing Sheets

(58) Field of Classification Search
CPC ............ G03F 7/70475; G03F 7/70725; G03F 7/2022; G02B 26/0833; G02B 26/0841; G02B 27/0043; G02B 27/4205
See application file for complete search history.

(56) References Cited

U.S. PATENT DOCUMENTS

| | | | |
|---|---|---|---|
| 2001/0026360 | A1 | 10/2001 | Baker et al. |
| 2003/0190536 | A1 | 10/2003 | Fries |
| 2007/0065729 | A1 | 3/2007 | Zait et al. |
| 2007/0065732 | A1 | 3/2007 | Lee et al. |
| 2007/0190438 | A1 | 8/2007 | Kim et al. |
| 2008/0316458 | A1* | 12/2008 | Sumi ................. B41J 2/465 355/69 |
| 2009/0059197 | A1 | 3/2009 | Nam et al. |
| 2009/0073411 | A1 | 3/2009 | Tanitsu |
| 2009/0091730 | A1 | 4/2009 | Tanaka |
| 2011/0134407 | A1 | 6/2011 | Sung |
| 2011/0261342 | A1 | 10/2011 | Tanitsu |
| 2013/0187669 | A1* | 7/2013 | Jayapala ................. G02B 1/00 324/679 |
| 2019/0293924 | A1* | 9/2019 | Thallner ............... G03F 7/2051 |

FOREIGN PATENT DOCUMENTS

| | | |
|---|---|---|
| CN | 1940718 A | 4/2007 |
| CN | 101006552 A | 7/2007 |
| CN | 203376558 U | 1/2014 |
| CN | 203825292 U | 9/2014 |
| CN | 106933049 A | 7/2017 |
| CN | 206479771 U | 9/2017 |
| EP | 1600817 A1 | 11/2005 |
| JP | 61190935 A | 8/1986 |
| JP | 62203133 A | 9/1987 |
| JP | 10032160 A | 2/1998 |
| JP | 2002506232 A | 2/2002 |
| JP | 2004-012899 A | 1/2004 |
| JP | 2006108465 A | 4/2006 |
| JP | 2007140166 A | 6/2007 |
| JP | 2010016351 A | 1/2010 |
| WO | 99/45437 | 9/1999 |
| WO | 2006/085626 A1 | 8/2006 |

OTHER PUBLICATIONS

International Search Report and Written Opinion dated Jun. 18, 2018; Appln. PCT/CN2018/080768.
The Second Chinese Office Action dated May 9, 2020; Appln. No. 201710770859.4.
The First Chinese Office Action dated Aug. 28, 2019; Appln. No. 201710770859.4.
Extended European Search Report dated May 10, 2021; Appln. No. 18772701.1.
Japanese Office Action dated Jan. 24, 2022; Appln. No. 2018-552056.

* cited by examiner

FIG. 7C acquiring of distribution matrix $A_{ij}$ of critical dimension

$$A_{ij} = \begin{pmatrix} a_{11} & \cdots & a_{i1} \\ \vdots & \ddots & \vdots \\ a_{1j} & \cdots & a_{ij} \end{pmatrix}$$

calculating of compensation factor matrix $C_{ij}$ $$C_{ij} = \begin{pmatrix} c_{11} & \cdots & c_{i1} \\ \vdots & \ddots & \vdots \\ c_{1j} & \cdots & c_{ij} \end{pmatrix}$$

converting into transmittance or reflectivity matrix $T_{ij}$ of micromirror $$T_{ij} = \begin{pmatrix} t_{11} & \cdots & t_{i1} \\ \vdots & \ddots & \vdots \\ t_{1j} & \cdots & t_{ij} \end{pmatrix}$$

EXPOSURE DEVICE, EXPOSURE METHOD AND PHOTOLITHOGRAPHY METHOD

The present application claims priority to Chinese patent application No. 201710770859.4, filed on Aug. 31, 2017, the entire disclosure of which is incorporated herein by reference as part of the present application.

TECHNICAL FIELD

Embodiments of the present disclosure relate to an exposure device, an exposure method and a photolithography method.

BACKGROUND

In the fabrication process of semiconductor devices or display substrates, each functional layer is usually patterned by adopting a photolithography process. The critical dimension (CD) of a photolithography process refers to the minimum size of lines that can be formed by the photolithography process. The uniformity of the critical dimension of patterns formed by using the photolithography process usually affects characteristics of a product, so it is an important factor affecting quality of the product.

SUMMARY

At least an embodiment of the present disclosure provides an exposure device, comprising an exposure light source and an optical-path assembly, wherein the optical-path assembly is configured to guide light emitted by the exposure light source to an exposing position, the optical-path assembly comprises a light valve array, the light emitted by the exposure light source is able to be guided to the light valve array and then guided to the exposing position after the light is transmitted or reflected by the light valve array, the light valve array comprises a plurality of light valve units, and optical transmittance or reflectivity of each of the light valve units is adjustable.

For example, in the exposure device provided by at least an embodiment of the present disclosure, the optical-path assembly comprises two light paths: a first exposure light path excluding the light valve array, and a second exposure light path comprising the light valve array.

For example, in the exposure device provided by at least an embodiment of the present disclosure, the optical-path assembly further comprises a first reflect mirror and a second reflect mirror, the first reflect mirror is configured to guide the light emitted by the exposure light source to the light valve array, and the second reflect mirror is configured to guide the light subjected to transmission or reflection of the light valve array to the exposing position.

For example, in the exposure device provided by at least an embodiment of the present disclosure, the light valve array is a reflective light valve array or a transmissive light valve array.

For example, in the exposure device provided by at least an embodiment of the present disclosure, the reflective light valve array comprises a micromirror array; the transmissive light valve array comprises an electrochromic light valve array or a liquid crystal light valve array.

For example, the exposure device provided by at least an embodiment of the present disclosure further comprises: a control device, configured to adjust the optical transmittance or reflectivity of each of the light valve units.

For example, in the exposure device provided by at least an embodiment of the present disclosure, the electrochromic material adopted by the electrochromic light valve array comprises $WO_3$, $MoO$, $Nb_2O_5$, $V_2O_5$, $NiO$, $IrO$ or $MnO$.

For example, in the exposure device provided by at least an embodiment of the present disclosure, the control device is configured to adjust the optical transmittance or reflectivity of each of the light valve units by adjusting a voltage applied to each light valve unit of the light valve array.

For example, the exposure device provided by at least an embodiment of the present disclosure further comprises: a storage device, configured to store a relationship between a voltage applied to each of the light valve units and the optical transmittance or reflectivity of each of the light valve units.

At least an embodiment of the present disclosure provides an exposure method using any one of the above exposure devices, comprising: acquiring an exposure compensating parameter, based on the exposure compensating parameter, adjusting reflectivity or transmittance of the light valve array; and performing exposure by the light that is emitted by the exposure light source and adjusted by the light valve array.

For example, the exposure method provided by at least an embodiment of the present disclosure further comprises: prior to acquiring of the exposure compensating parameter, firstly judging whether or not an exposure pattern obtained by performing exposure without use of the light valve array meets a predetermined requirement, and in case of not meeting, then acquiring the exposure compensating parameter.

For example, in the exposure method provided by at least an embodiment of the present disclosure, acquiring of the exposure compensating parameter comprises: obtaining a test pattern of critical dimension; getting a distribution matrix $A_{ij}$ of the critical dimension based on the test pattern; and calculating a compensating factor matrix $C_{ij}$ from a target critical dimension matrix $a_{target}$ and the distribution matrix $A_{ij}$ of the critical dimension to function as the compensating parameter.

For example, in the exposure method provided by at least an embodiment of the present disclosure, the compensating factor matrix $C_{ij}$ is calculated from the target critical dimension matrix $a_{target}$ and the distribution matrix $A_{ij}$ of the critical dimension by the following formula:

$$C_{ij} = \frac{a_{target}}{A_{ij}}$$

For example, in the exposure method provided by at least an embodiment of the present disclosure, the optical transmittance or reflectivity of a plurality of light valve units of the exposure device is adjusted according to the compensating factor matrix $C_{ij}$, and the method further comprises: converting the compensating factor matrix $C_{ij}$ into an optical transmittance or reflectivity matrix $T_{ij}$ of the light valve array, and adjusting the optical transmittance or reflectivity of the plurality of light valve units of the exposure device with use of the optical transmittance or reflectivity matrix $T_{ij}$.

For example, in the exposure method provided by at least an embodiment of the present disclosure, when the light valve array is a transmissive light valve array, the compensating factor matrix $C_{ij}$ is converted into the transmittance matrix $T_{ij}$ of the light valve array by a following formula:

$$T_{ij} = \frac{C_{ij}}{t_{trans}} = \begin{pmatrix} t_{11} & \cdots & t_{i1} \\ \vdots & \ddots & \vdots \\ t_{1j} & \cdots & t_{ij} \end{pmatrix}, t_{trans} = \frac{\max(C_{ij})}{T_{max}}$$

where $T_{max}$ is maximum transmittance of the light valve units for fabricating the light valve array, max $(C_{ij})$ is a maximum value of compensating factors; and $t_{trans}$ is a transmittance factor.

For example, in the exposure method provided by at least an embodiment of the present disclosure, adjusting the optical transmittance or reflectivity of the plurality of light valve units of the exposure device with use of the optical transmittance or reflectivity matrix $T_{ij}$ comprises: letting the optical transmittance or reflectivity matrix $T_{ij}$ be correspondent with the plurality of light valve units, so as to obtain a deviation of optical transmittance or reflectivity of each of the light valve units, and adjusting the optical transmittance or reflectivity of each of the light valve units based on the deviation.

For example, in the exposure method provided by at least an embodiment of the present disclosure, a control device of the exposure device adjusts a voltage of each of the light valve units of the exposure device according to a relationship between the voltage applied to the light valve units and the optical transmittance or reflectivity of the light valve units, so as to adjust the optical transmittance or reflectivity of each of the light valve units.

For example, in the exposure method provided by at least an embodiment of the present disclosure, a distribution matrix $A_{ij}$ of the critical dimension is inputted into a control device of the exposure device, and the control device executes a calculation/conversion process, and adjusts voltage applied to a plurality of light valve units of the exposure device so as to adjust the optical transmittance or reflectivity of each of the light valve units.

For example, in the exposure method provided by at least an embodiment of the present disclosure, the test pattern of critical dimension is a pattern obtained after a developing process; or the test pattern of critical dimension is a pattern obtained after an etching process.

At least an embodiment of the present disclosure provides a photolithography method, comprising any one of the above-mentioned exposure methods.

BRIEF DESCRIPTION OF THE DRAWINGS

In order to clearly illustrate the technical solution of the embodiments of the disclosure, the drawings used in the description of the embodiments or relevant technologies will be briefly described in the following; it is obvious that the described drawings are only related to some embodiments of the disclosure and thus are not limitative of the disclosure.

REFERENCE NUMERALS

100—workpiece to be processed; 201—exposure light source; 202—light valve array; 2020—light valve unit; 203—mask; 204—first reflect mirror, 205—second reflect mirror, 206—control device; 207—storage device

DESCRIPTION OF THE PREFERRED EMBODIMENTS

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

As discovered by the inventor of the present disclosure in research, in a photolithography process, there are many factors affecting the uniformity of the patterns obtained through photolithographic such as uniformity of critical dimension, and these factors can be broadly divided into three categories. Firstly, the uniformity of critical dimension of patterns formed on a photomask, which directly affects the uniformity of critical dimension formed on a target product. Secondly, the uniformity of an exposing machine itself, for example, the uniformity of an exposure light source, lens, etc., has a direct effect on the uniformity of critical dimension formed on the target product. Thirdly, coating, development and etching of a photoresist and other procedures, which also have greater influence on the uniformity of critical dimension.

However, methods to improve the uniformity of patterns obtained through photolithographic (e.g., the uniformity of critical dimension) available now often aim at just certain one of the above factors, for example only to improve to the photomask. For example, the light intensity transmitted by the photomask is controlled by forming various kinds of defects on a surface of the photomask or inside the photomask, but adjustment of the light intensity by using this method must involve recall of the photomask and improvement to the photomask by way of an additional process. This process increases manufacturing cost of the photomask and takes a longer time, so the effects achievable by the method are limited.

At least an embodiment of the present disclosure provides an exposure device, comprising an exposure light source and an optical-path assembly, wherein the optical-path assembly is configured to guide light emitted by the exposure light source to an exposing position, the optical-path assembly includes a light valve array, light emitted by the exposure light source is able to be guided to the light valve array, and then guided to the exposing position after the light is transmitted or reflected by the light valve array, the light valve array includes a plurality of light valve units, optical transmittance or reflectivity of each of the light valve units is adjustable.

At least an embodiment of the present disclosure provides an exposure method using the above exposure device, and the method comprises: acquiring an exposure compensating parameter, based on the exposure compensating parameter, adjusting the reflectivity or transmittance of the light valve array; performing exposure by the light that is emitted by the exposure light source and adjusted by the light valve array.

At least an embodiment of the present disclosure provides a photolithography method that comprises the exposure method.

Hereinafter, the exposure device, exposure method and photolithography method of the present disclosure will be described with aid of several specific embodiments.

Embodiment One

Figure 1A:
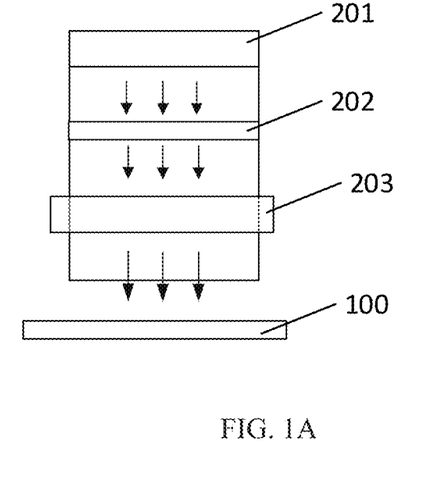
FIG. 1A is a schematic view one illustrating an exposure device provided by an embodiment of the present disclosure.
Figure 1B:
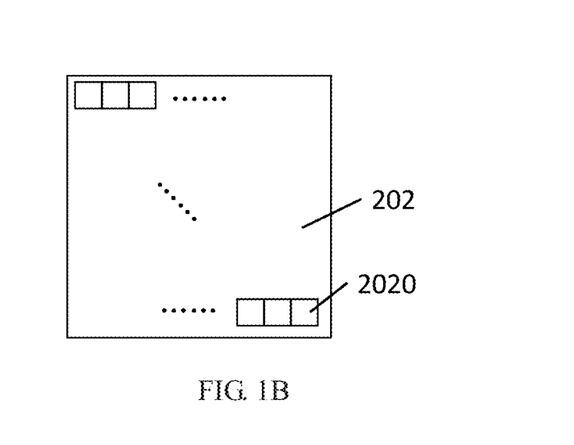
FIG. 1B is a schematically plan view illustrating a light valve array of an exposure device provided by an embodiment of the present disclosure.
Figure 2:
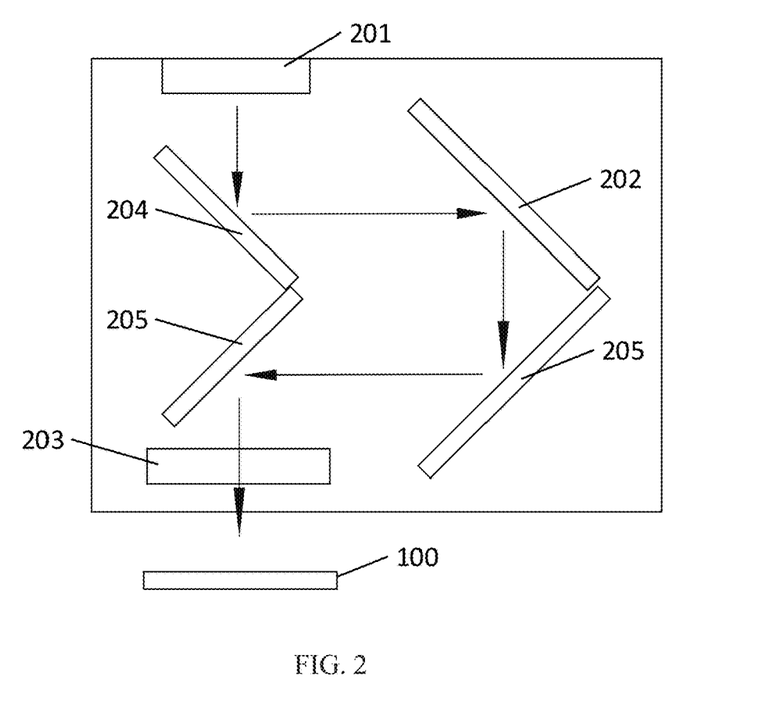
FIG. 2 is a schematic view two illustrating an exposure device provided by an embodiment of the present disclosure.

According to the present embodiment, there is provided an exposure device, and as shown in FIG. 1A and FIG. 2, the exposure device includes an exposure light source 201 and an optical-path assembly. The optical-patch assembly is configured to guide the light emitted by the exposure light source 201, via an exposure mask 203, to an exposing position, for exposing a photoresist layer that has been coated on a workpiece 100 to be processed (e.g., a substrate or wafer) placed at the exposing position; the optical-path assembly includes a light valve array 202, and the light emitted by the exposure light source 201 can be guided to the light valve array 202, and then be guided to the exposing position after being transmitted or reflected by the light valve array 202. As shown in FIG. 1B, the light valve array 202 can include a plurality of light valve units 2020, and optical transmittance or reflectivity of these light valve units 2020 can be adjusted so that the light intensity arriving at the light valve array 202 can be adjusted separately.

For example, in this embodiment, the optical transmittance or reflectivity of each light valve unit 2020 of the light valve array 202 in the optical-path assembly may be adjusted, and so the light valve array 202 can selectively transmit or reflect the light emitted by the exposure light source 201 in a region-dependent manner, so as to control the final intensity and distribution of the light guided to the exposing position in the exposure device. In this embodiment, for example, the position of each light valve unit 2020 of the light valve array 202 may also be adjusted (e.g., the tilt angle of each light valve unit 2020 or the like may be adjusted, so as to adjust the propagating direction of light and guide light to the exposing position accurately.

In the present embodiment, the optical-path assembly of the exposure device may include two light paths; one light path is an ordinary light path, that is, a first exposure light path which excludes the light valve array 202, in which the exposure light source 201 can be directly used for exposure; and the other light path is a compensating light path, that is, a second exposure light path comprising the light valve array 202, by which light from the exposure light source 201 can be adjusted so as to control the final exposure intensity and distribution of the exposure device. In this embodiment, two light paths may, for example, be separately arranged in different areas of the exposure device, so different light paths may be selected for exposure according to requirements. For another example, two light paths may sham at least part of a light path channel, and in this case the light valve array 202 may be arranged to be a detachable structure and be selectively mounted according to exposure requirements. When the second exposure light path including the light valve array 202 is required for exposure, the light valve array 202 may be installed in the light path channel; when the first exposure light path excluding the light valve array 202 is required to be used for exposure, the light valve array 202 in the light path channel may be detached.

In another example of this embodiment, as shown in FIG. 1, the exposure device includes an exposure light source 201, a light valve array 202, and may further include, for example, a mask carrier (not shown) provided at the light exit of the exposure device, and a mask 203 is detachably mounted on the mask carrier. In this example, the light valve array 202 is a transmissive light valve array, and light emitted by the exposure light source 201 are guided to a workpiece 100 to be processed that is placed at an exposing position after the light is transmitted by the light valve array 202. The exposure device utilizes each light valve unit of the light valve array 202 to selectively transmit light emitted by the exposure light source 201, thereby achieving the technical effect of controlling the final exposure intensity and distribution of the exposure device. In this example, the exposure device may further include, for example, a lens assembly (not shown in the figure) and so on, and the lens assembly may be mounted, for example, between the exposure light source 201 and the light valve array 202 to assist in adjusting the light emitted by the exposure light source 201.

In another example of this embodiment, as shown in FIG. 2, the exposure device also includes an exposure light source 201, a light valve array 202, and a mask carrier (not shown) arranged at the light exit of the exposure device for detachable installation of a mask 203. Unlike the previous example, in this example, the light valve array 202 is a reflective light valve array, and an optical-path assembly of the exposure device further includes a first reflect mirror 204 and a second reflect mirror 205. Light emitted by the exposure light source 201 are led by the first reflect mirror 204 to the light valve array 202, and the light reflected by the light valve array 202 are led by the second reflect mirror 205 to a workpiece 100 to be processed that is placed in an exposing position. The exposure device utilizes each light valve unit of the light valve array 202 to selectively reflect light emitted by the exposure light source 201, thereby achieving the technical effect of controlling the final exposure intensity and distribution of the exposure device. In this example, the exposure device may further include a lens assembly or the like (not shown in the figure) likewise, and the lens assembly may be mounted, for example, between the exposure light source 201 and the first reflect mirror 204 or at other suitable location so as to make auxiliary adjustment of the light emitted by the exposure light source 201.

In the exposure device, the exposure light source 201 may be selected as required to be a light source with appropriate wavelength, and for example, it may be a light source of G-line (436 nm) in ultraviolet spectrum, i-line (365 nm) developed to 248 nm, 193 nm, extreme ultraviolet light (EUV) or even X-ray, etc.

In this example, the first reflect mirror 204 and the second reflect mirror 205 may be selectively installed, and the number, mounting position and installation angle of the first reflect mirror 204 and the second reflect mirror 205 may be adjusted according to the required exposure position. For example, when the first reflect mirror 204 and the second reflect mirror 205 are not installed, light emitted by the exposure light source 201 does not pass through the light valve array 202, the exposure light path in this case is the first exposure light path that excludes the light valve array 202; when the first reflect mirror 204 and the second reflect mirror 205 are installed, light emitted by the exposure light source 201 are guided by the first reflect mirror 204 to the light valve array 202, and is then reflected to the exposure position by the second reflect mirror 205 after the light is modulated by the light valve array 202, the exposure light path at this time is the second exposure light path that includes the light valve array 202. In this example, according to positional relationship between the exposure device and the exposure position as well as mounting position of the light valve array 202, one first reflect mirror 204 is provided, two second reflect mirror 205 is provided, and the installation as shown in FIG. 2 is carried out. The reflect mirrors may be plane mirrors, or when scaling or other operation is required, may be curved mirrors, such as concave mirrors, convex mirrors or the like. The position of each light valve unit of the light valve array 202 may be adjusted as well, so that the light reflected by the light valve array 202 can be directed to the exposure position.

As described above, in the embodiments, the light valve array may be for example a reflective light valve array or a transmissive light valve array, and the type may be selected according to demand.

The reflective light valve array may, for example, be a micromirror array, such as a digital micromirror array, such as a high-reflectivity aluminum micromirror array, and optical reflectivity of the micromirror array may be adjusted with digital signals, thereby modulating the incident light emitted from the light source according to the signals. The micromirror array is such as an MEMS (micro-electromechanical system) type micromirror array. The basic principle of the MEMS type micromirror array is to cause a movable micromirror to rotate or translate under the action of static electricity (or magnetic force), so that the propagating direction or phase of input light can be changed.

The transmissive light valve array may be, for example, an electrochromic light valve array, a liquid crystal light valve array or the like. The electrochromic material used in the electrochromic light valve array may be, for example, $WO_3$, $MoO$, $Nb_2O_5$, $V_2O_5$, $NiO$, $IrO$, $MnO$ or the like, and this embodiment places no limitation on the specific category of the electrochromic material. The optical transmittance of these materials can be adjusted with the aid of the magnitude of an externally applied voltage. For example, an electrochromic light valve array includes two substrates opposed to each other, with a layer of electrochromic material interposed therebetween. At least one of the two substrates may be an array substrate, on which a corresponding drive array is provided, while the other substrate is an opposing substrate, on which a common electrode is arranged. The drive array includes a plurality of pixel units; each of the pixel units can correspond to one light valve unit, and includes such as a thin film transistor, a pixel electrode, and other circuital structure. The pixel electrode and a common electrode of each of the light valve units can act to apply a voltage difference across the electrochromic material of the corresponding part so as to change its transmittance. The liquid crystal light valve array can act to control the rotational angle of liquid crystal molecules with the aid of an electrical signal and then the transmittance of light is adjusted.

For example, the liquid crystal light valve array includes two substrates opposed to each other, with a layer of liquid crystal material interposed therebetween, and the two substrates are respectively provided with two polarizers, the polarizing axes of which are perpendicular to each other. At least one of the two substrates may be an array substrate, on which a corresponding drive array is provided, while the other substrate is an opposing substrate, on which a common electrode is arranged. The drive array includes a plurality of pixel units, each of which may correspond to one light valve unit, and include such as a thin film transistor, a pixel electrode, and other circuital structure. The pixel electrode and a common electrode of each of the light valve units can act to apply a voltage difference to the liquid crystal material of the corresponding part so as to change its transmittance.

Figure 3:
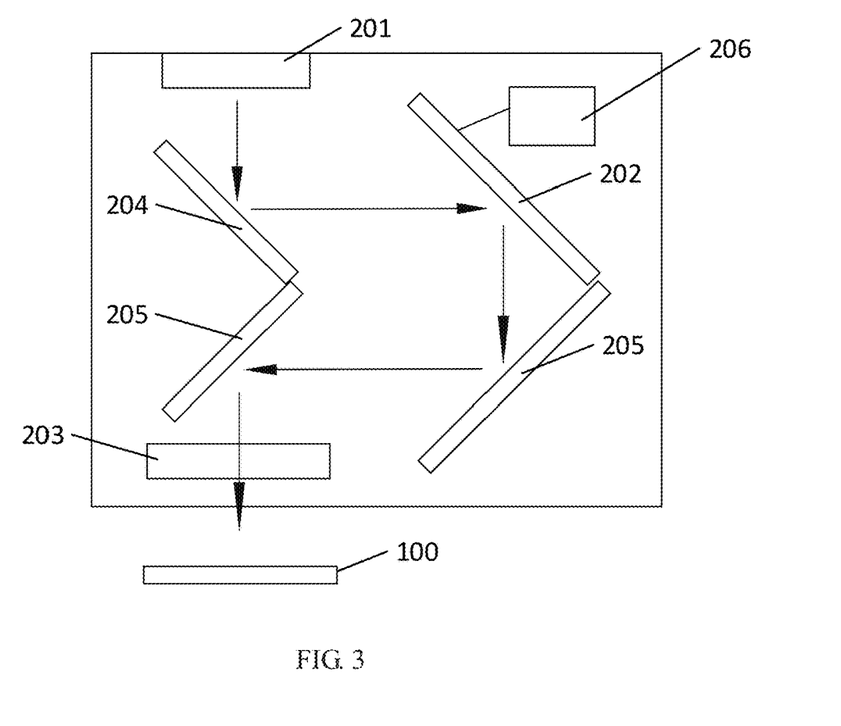
FIG. 3 is a schematic view three illustrating an exposure device provided by an embodiment of the present disclosure.

In this embodiment, as shown in FIG. 3, the exposure device may further include a control device 206 which may be, for example, electrically connected to the light valve array 202, and be configured to provide the light valve array 202 with display signals so as to adjust the optical transmittance or reflectivity of the light valve array 202. For example, the control device 206 may be configured to be capable of adjusting the optical transmittance or reflectivity of each light valve unit in the light valve array 202. For example, when the light valve array 202 is an electrochromic light valve array, the control device 206 may be configured to adjust the optical transmittance of each light valve unit by adjusting a voltage applied to each light valve unit in the light valve array 202. The controller may be in various forms such as a central processor, a microprocessor, a programmable logic controller (PLC) and so on, and is configured to be able to execute a computer program or instructions, and the embodiments of the present disclosure place no limitation on this aspect.

Figure 4:
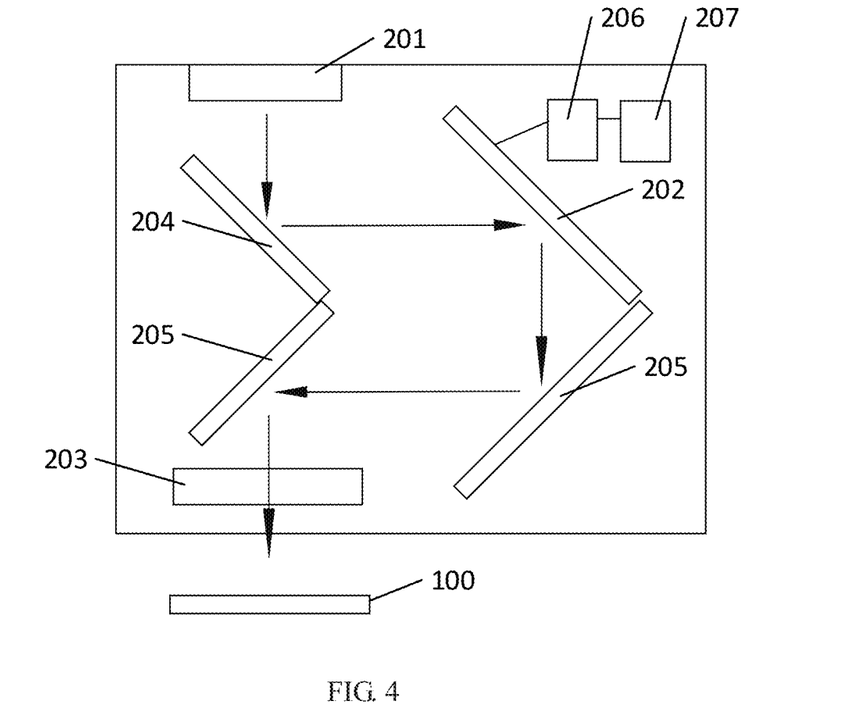
FIG. 4 is a schematic view four illustrating an exposure device provided by an embodiment of the present disclosure.

In this embodiment, as shown in FIG. 4, the exposure device may further include a storage device 207, which may, for example, store a relationship between an electrical signal applied to a light valve unit and the optical transmittance or reflectivity of the light valve unit. In this way, the control device 206 makes an individualized adjustment to an electrical signal applied to each light valve unit according to the relationship, and then the optical transmittance or reflectivity of the light valve unit is adjusted. For example, when the light valve array 202 is an electrochromic light valve array, the storage device 207 may store the relationship between a voltage applied to a light valve unit and the optical transmittance of the light valve unit. Thus, the control device 206 can adjust the voltage applied to each light valve unit according to the relationship, and then the optical transmittance of each light valve unit is adjusted. The storage device 207 may include a magnetic storage medium, a semiconductor storage medium, or the like, and may be a volatile storage device or a non-volatile storage device, and the embodiments of the present disclosure place no limitation on in this aspect.

The exposure device provided by this embodiment may be used, for example, in a photolithography process, and thus the light emitted by the exposure light source 201 may be useful for exposure by means of selectively utilizing a normal light path or a compensating light path, then light exiting from the exposure device is illuminated to an exposing position via a mask 203, for example, to a workpiece 100 to be processed such as a substrate, wafer or the like, thereby realizing patterning on the workpiece 100 to be processed. When a compensating light path is utilized for exposure in the exposure device provided by the present embodiment, the technical effect of controlling the final exposure amount of the exposure device in a region-dependent manner can be achieved by adjusting the optical transmittance or reflectivity of each light valve unit in the light valve array 202. When the exposure device is used in photolithography process, the photolithographic pattern can be made to be more uniform, or closer to the desired target pattern.

Embodiment Two

Figure 5:
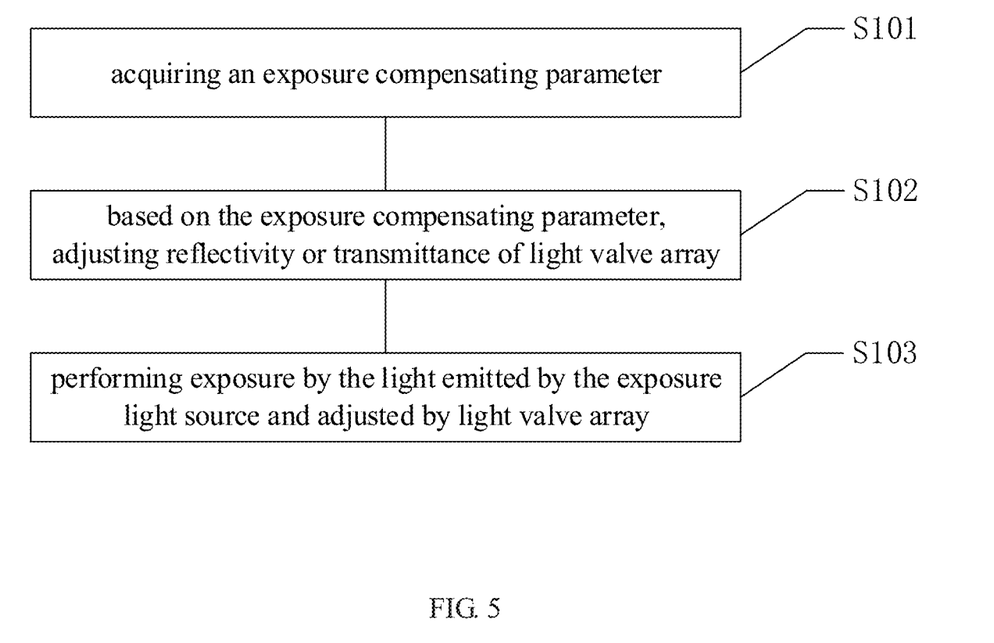
FIG. 5 is a flowchart one illustrating an exposure method provided by an embodiment of the present disclosure.

According to the present embodiment, there is provided an exposure method by employing any of the above exposure devices for exposure, by which, the exposure process can be compensated, so as to obtain an exposure pattern that is more uniform or closer to the desired target pattern. Thus, quality of the patterning process is improved. As shown in FIG. 5, the method includes the following operations S101~S103.

S101: acquiring an exposure compensating parameter.

In this embodiment, an exposure compensating parameter may be acquired, for example, by a test pattern obtained after an exposure process is performed once. The test pattern may be, for example, a pattern obtained after performing a development process, or may also be a pattern obtained after performing an etching process. By comparing the test pattern with a target pattern desired to be obtained, the difference between the test pattern and the target pattern and the difference degree are obtained, and then an exposure compensating parameter is obtained. The exposure compensating parameter may be, for example, a numerical value, and may also be a numerical matrix, and its concrete form is not limited here.

S102: adjusting the reflectivity or transmittance of the light valve array according to the exposure compensating parameter.

In this embodiment, for example, the reflectivity or transmittance of the light valve array may be adjusted by a control device of the exposure device according to the exposure compensating parameter, and for example, the optical transmittance or reflectivity of each light valve unit may be adjusted by adjusting an electrical signal applied to the light valve unit with use of the control device. When the relationship between an electrical signal applied to a light valve unit and the optical transmittance or optical reflectivity of the light valve unit is stored in a storage device of the exposure device, the control device can make an individualized adjustment to an electrical signal applied to each light valve unit according to the relationship and the exposure compensating parameter, and then the optical transmittance or reflectivity of each light valve unit is adjusted. For example, when the light valve array is an electrochromic light valve array and the relationship between a voltage applied to a light valve unit and the optical transmittance of the light valve unit is stored in a storage device, the control device of the exposure device can adjust the size of a voltage applied to each light valve unit according to the relationship and the exposure compensating parameter purposefully and respectively so as to adjust transmittance of each light valve unit.

S103: using light that is emitted from the exposure light source and has been adjusted by the light valve array for exposure.

In the present embodiment, because the optical transmittance or reflectivity of each light valve unit of the light valve array is adjusted purposefully by the control device according to the exposure compensating parameter, and then the light emitted by the exposure light source is adjusted, the pattern obtained by performing an exposure process with the adjusted light get closer to the desired target pattern. For example, a photoresist layer subjected to exposure is-developed to obtain a photoresist pattern, which can be used as an etching mask, to etch other structural layers beneath the photoresist layer. The etching process may be either dry etching or wet etching.

Figure 6:
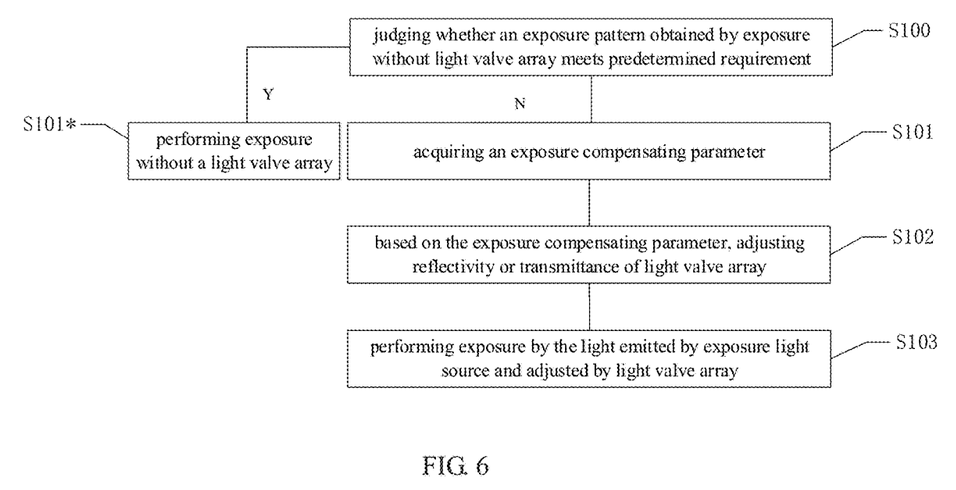
FIG. 6 is a flowchart two illustrating an exposure method provided by an embodiment of the present disclosure.

In another example of this embodiment, as shown in FIG. 6, the exposure method further includes an operation S100 prior to the operation S101.

S100: judging whether or not an exposure pattern in the case of performing an exposure without use of a light valve array meets a predetermined requirement.

The judging process is usually performed before the step S101, i.e., prior to acquiring of the exposure compensating parameter. When the obtained result is a positive result, that is, when an exposure pattern in the case of performing an exposure without use of a light valve array meets a predetermined requirement, exposure can be carried out using an ordinary optical path of the exposure device. Namely, the process advance to the step S101*, in which exposure is performed using the first exposure light path that does not include a light valve array. When the obtained result is a negative result, that is, when an exposure pattern in the case of performing an exposure without use of a light valve array does not meet a predetermined requirement, exposure can be carried out by using a compensating optical path of the exposure device. Namely, the process switches to the step S101, exposure is performed by using a second exposure light path that includes a light valve array, and at this time an exposure compensating parameter is further acquired.

Embodiment Three

According to the present embodiment, there is provided an exposure method, which may be, for example, used in a photolithography process to obtain a uniform critical dimension. The photolithography process includes, for example, coating of a photoresist, exposing the photoresist by using the exposure method provided by the present embodiment, developing treatment of the photoresist to obtain a photoresist pattern, transferring of the photoresist pattern to the required material so as to obtain a photolithographic pattern on the material, etc. In the present embodiment, the exposure method provided by embodiments of the present disclosure will be described with reference to an example in which the uniformity of critical dimension of photolithographic patterns is achieved.

Figure 7A:
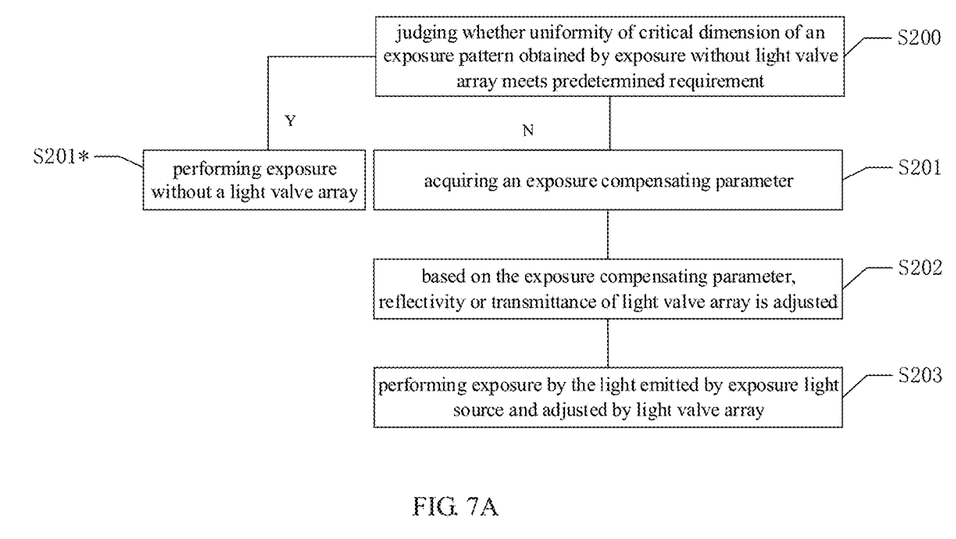
FIG. 7A is a flowchart illustrating a photolithography method provided by an embodiment of the present disclosure.

In the present embodiment, as shown in FIG. 7A, the exposure method includes steps S200 to S203.

S200: judging whether or not the critical dimension of an exposure pattern obtained in the case of performing exposure without use of a light valve array meets a predetermined requirement.

In the present embodiment, for example, a test pattern of critical dimension may be obtained firstly, and the pattern may be such as a pattern obtained after a development process, and may also be a pattern obtained after an etching process. The test pattern can reflect the distribution of size of the critical dimension. According to the uniformity of critical dimension in the test pattern of critical dimension, it is judged whether or not a pattern obtained in the case of performing exposure without use of a light valve array meets a predetermined requirement. For example, it is measured whether or not the critical dimension at each location in the test pattern of critical dimension exceeds a preset maximum critical dimension, or whether or not the difference between the maximum critical dimension and the minimum critical dimension in the test pattern exceeds the process requirement. When the obtained uniformity of critical dimension in the test pattern of critical dimension meets the standard, that is, when the judgment result is positive, an ordinary light path of the exposure device can be used for exposure. Namely, the process goes to step S201*, exposure is performed by using the first exposure light path excluding a light valve array. Conversely, when the obtained uniformity of critical dimension in the test pattern of critical dimension does not meet the standard, that is, when the obtained result is negative, a compensating light path of the exposure device can be used for exposure. Namely, the process goes to step S201, exposure is performed using a second exposure light path including a light valve array.

S201, acquiring an exposure compensating parameter.

Figure 7B:
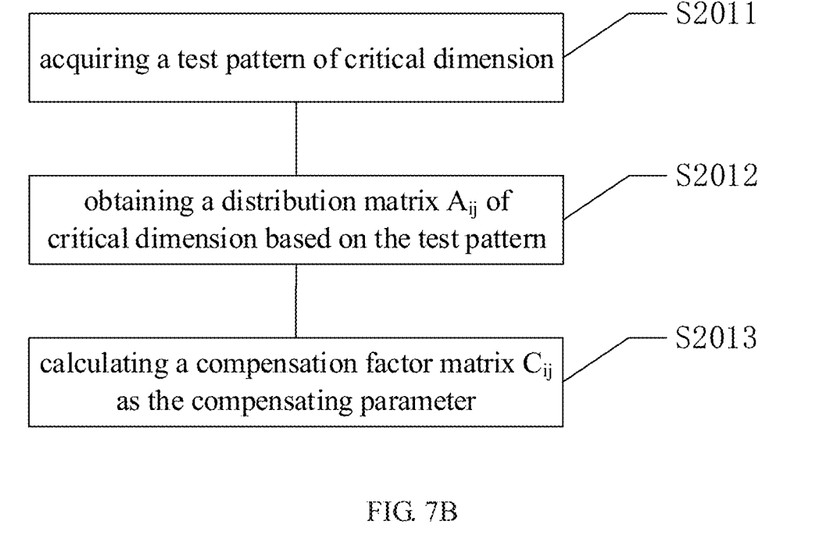
FIG. 7B is a flowchart one illustrating acquisition of an exposure compensating parameter in a photolithography method provided by an embodiment of the present disclosure.

As shown in FIG. 7B, in an example, acquisition of the exposure compensating parameter includes operations S2011 to S2013.

S2011, obtaining a test pattern of critical dimension.

In this embodiment, the test pattern may be the test pattern of critical dimension obtained in step S200, and may also be a test pattern of critical dimension obtained newly. In order to simplify process and save time, the test pattern of critical dimension obtained in step S200 is selected in this embodiment, and this test pattern can reflect the influence of each step in the exposure process on the exposure pattern.

S2012: obtaining a distribution matrix $A_{ij}$ of critical dimension based on the test pattern.

In this embodiment, for example, an automatic optical detection device can be used to detect the size of the critical dimension at each location in the test pattern, and then a distribution matrix $A_{ij}$ of critical dimension is generated.

S2013: obtaining a compensation factor matrix $C_{ij}$ by calculation.

In this embodiment, for example, the compensation factor matrix $C_{ij}$ may be calculated from a target critical dimension matrix $a_{target}$ and the distribution matrix $A_{ij}$ of critical dimension, so as to act as an exposure compensating parameter. In this embodiment, for example, the compensation factor matrix $C_{ij}$ may be obtained by calculation with the following formula:

$$C_{ij} = \frac{a_{target}}{A_{ij}}$$

S202: adjusting the reflectivity or transmittance of the light valve array according to the exposure compensating parameter.

In this embodiment, for example, the reflectivity or transmittance of a light valve array may be adjusted by a control device of the exposure device based on the compensation factor matrix $C_{ij}$ obtained in S2013, and each matrix element corresponds to one light valve unit of the light valve array. For example, the optical transmittance or reflectivity of each light valve unit may be adjusted by adjusting an electrical signal applied to the light valve unit by way of a control device. When the relationship between an electrical signal applied to a light valve unit and the optical transmittance or reflectivity of the light valve unit is stored in a storage device of the exposure device, the control device can purposefully adjust an electrical signal applied to each light valve unit according to the relationship and the compensation factor matrix $C_{ij}$, and then the optical transmittance or reflectivity of light valve units is adjusted.

For example, when the light valve array is a transmissive light valve array, and the relationship between a voltage applied to a light valve unit and the optical transmittance of the light valve unit is stored in the storage device, the control device of the exposure device can adjust a voltage applied to each light valve unit of the exposure device according to the compensation factor matrix $C_{ij}$ and the relationship so as to adjust the optical transmittance of each light valve unit.

S203: using light emitted from the exposure source and adjusted by the light valve array for exposure.

In the present embodiment, in view of the fact that the control device has purposefully adjusted the optical transmittance or reflectivity of each light valve unit according to the compensation factor matrix $C_{ij}$, and thus light emitted by the exposure light source are adjusted in a region-dependent manner, the pattern obtained by performing an exposure process using the adjusted light gets closer to the desired target pattern, and the critical dimension in the obtained pattern is more uniform.

Figure 7C:
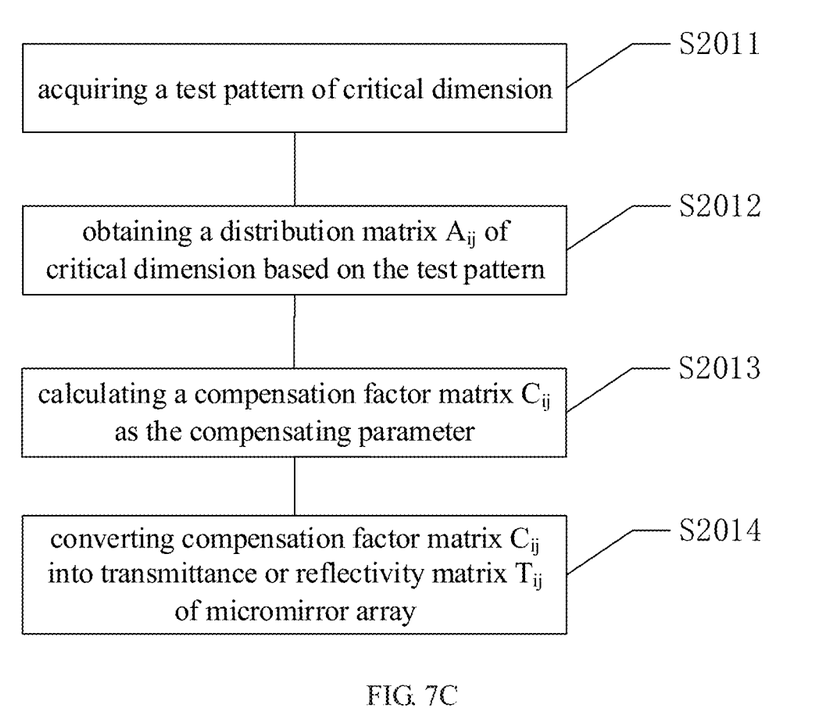
FIG. 7C is a flowchart two illustrating acquisition of an exposure compensating parameter in a photolithography method provided by an embodiment of the present disclosure.

In another example of this embodiment, as shown in FIG. 7C, based on the example shown in FIG. 7B, acquisition of an exposure compensating parameter may further include the following operation S2014:

S2014: converting the compensation factor matrix $C_{ij}$ into an optical transmittance or reflectivity matrix $T_{ij}$ of the light valve array.

In this example, it is possible that the compensation factor matrix $C_{ij}$ is converted into the transmittance or reflectivity matrix $T_{ij}$ of the light valve array, and then the matrix $T_{ij}$ is used to adjust the optical transmittance or reflectivity of multiple light valve units of the exposure device. For example, when the light valve array is a transmissive light valve array, the compensation factor matrix $C_{ij}$ may be converted into the optical transmittance matrix $T_{ij}$ of the light valve array by the following formula:

$$T_{ij} = \frac{C_{ij}}{t_{trans}} = \begin{pmatrix} t_{11} & \cdots & t_{i1} \\ \vdots & \ddots & \vdots \\ t_{1j} & \cdots & t_{ij} \end{pmatrix}, t_{trans} = \frac{\max(C_{ij})}{T_{max}}$$

where $T_{max}$ is the maximum transmittance of the optical valve units forming the light valve array, max(Cy) is the maximum value of each compensation factor, and $T_{trans}$ is a transmittance factor. When the light valve array is a reflective light valve array, the optical reflectivity matrix of the light valve array may be obtained similarly and useable for the subsequent compensating operation, and details are omitted here.

In the present embodiment, adjustment of the optical transmittance or reflectivity of a plurality of light valve units of an exposure device with use of the optical transmittance or reflectivity matrix $T_{ij}$ includes that, the optical transmittance or reflectivity matrix $T_{ij}$ is made to correspond to the plurality of light valve units, so as to obtain the deviation of the optical transmittance or reflectivity of each light valve unit, and the optical transmittance or reflectivity of each light valve unit is adjusted according to the deviation.

Figure 8:
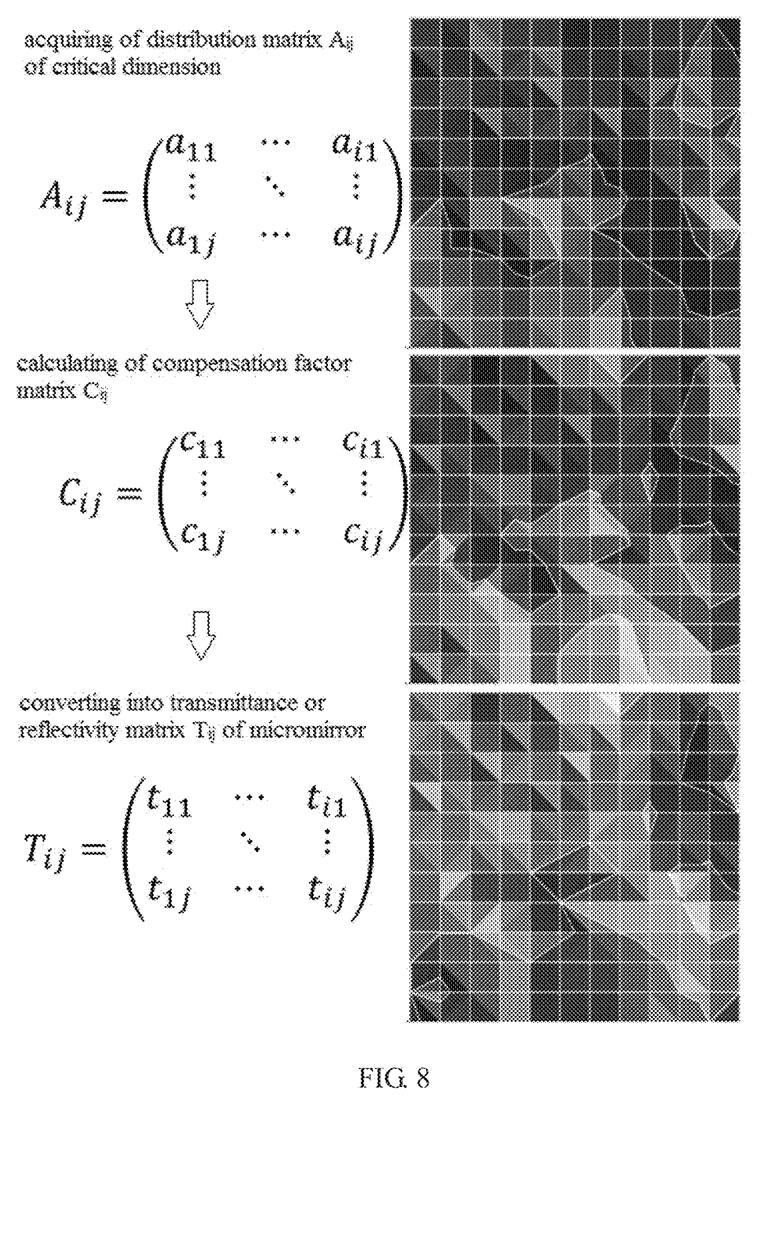
FIG. 8 is a schematic view illustrating computational process of an exposure compensating parameter provided by an embodiment of the present disclosure.
Figure 9:
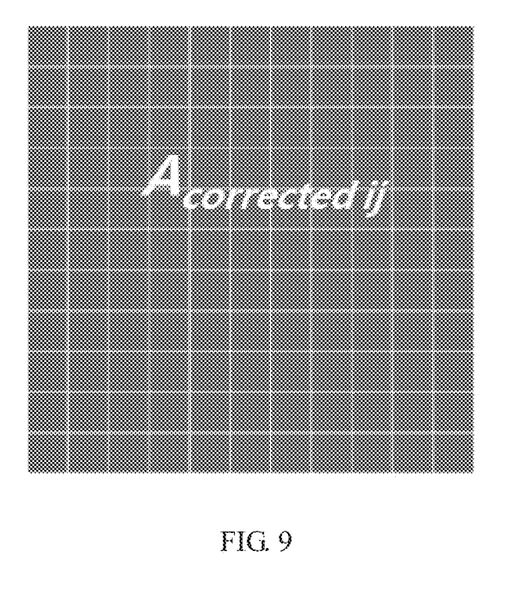
FIG. 9 is a schematic view illustrating uniformity of pattern achieved by exposure compensation provided by an embodiment of the present disclosure.

In this embodiment, for example, it is possible that by way of inputting a distribution matrix $A_{ij}$ of critical dimension into a control device of the exposure device, a calculation/conversion process from the distribution matrix of critical dimension $A_{ij}$ to a compensation factor matrix $C_{ij}$ and then to an optical transmittance or reflectivity matrix $T_{ij}$ as shown in FIG. 8 is executed by the control device (in the figure, contour maps of numerical values in the matrix $A_{ij}$, matrix $C_{ij}$ and matrix $T_{ij}$ are illustratively given, and they represent the size distribution of values in the matrix), and the control device adjusts electrical signals applied to the plurality of light valve units of the exposure device. For example, when the light valve array is a transmissive light valve array, a voltage applied to each light valve unit is adjusted so as to adjust the optical transmittance of each light valve unit. The pattern obtained by performing exposure with a compensating optical path that passes through the light valve array with adjusted transmittance has a more uniform critical dimension, as shown in FIG. 9, and the critical dimension distribution matrix $A_{correctedij}$ of the finally obtained pattern is basically the same as the target critical dimension matrix $a_{target}$ or the error is within the acceptable range of the process.

According to at least one embodiment of the present disclosure, there are provided an exposure device, an exposure method and a lithography method, which have at least one of the following beneficial effects:

(1) An exposure device provided by an embodiment of the present disclosure has two optical paths, and upon exposure, a normal light path or a compensating light path with a light valve array can be selected for an exposure process according to actual situations, thereby improving exposure quality of the exposure device.

(2) A compensating light path possessed by an exposure device provided in an embodiment of the present disclosure can make use of a light valve array to adjust light emitted by an exposure light source, the light valve array having a plurality of light valve units, and therefore, the technical effect of adjusting the final exposure amount of the exposure device in a region-dependent manner can be achieved.

(3) Regarding an exposure method provided by an embodiment of the present disclosure, an exposure compensating parameter can be obtained based on a test pattern, and is useful for adjusting the optical transmittance or reflectivity of each light valve unit of the light valve array of the exposure device to control the final exposure amount of the exposure device, so that the obtained exposure pattern is closer to the desired target pattern and uniformity of the exposure pattern is improved.

(4) An exposure method provided by an embodiment of the present disclosure can be used in a photolithography process, an exposure compensating parameter can be acquired by the exposure method based on a test pattern, which reflects influences of various factors such as a photomask, an exposure device, a development process, a photolithography process and the like on the final photolithographic pattern, and therefore, by means of using the exposure compensating parameter to control the final exposure amount of the exposure device, the obtained photolithographic pattern can be made to get closer to the desired target pattern. Consequently, the uniformity of photolithographic patterns is improved, and for example, uniformity of the critical dimension of photolithographic patterns is improved.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, features in one embodiment or in different embodiments can be combined.

What are described above involves the illustrative embodiments of the disclosure only and not limitative to the scope of the disclosure. The modification or substitution which can be conceived by those skilled in the art related to the present disclosure should be in the protection scope of the present disclosure. The scopes of the present disclosure are defined by the accompanying claims.

What is claimed is:

1. An exposure method using an exposure device, wherein the exposure device comprises an exposure light source and an optical-path assembly, the optical-path assembly is configured to guide light emitted by the exposure light source to an exposing position, the optical-path assembly comprises a light valve array, the light emitted by the exposure light source is able to be guided to the light valve array and then guided to the exposing position after the light is transmitted or reflected by the light valve array, the light valve array comprises a plurality of light valve units, and optical transmittance or reflectivity of each of the light valve units is adjustable; and the exposure method comprises:

acquiring an exposure compensating parameter;

based on the exposure compensating parameter, adjusting reflectivity or transmittance of the light valve array; and performing exposure by the light that is emitted by the exposure light source and adjusted by the light valve array;

wherein acquiring of the exposure compensating parameter comprises:

obtaining a test pattern of critical dimension;

getting a distribution matrix $A_{ij}$ of the critical dimension based on the test pattern; and calculating a compensating factor matrix $C_{ij}$ from a target critical dimension matrix $a_{target}$ and the distribution matrix $A_{ij}$ of the critical dimension to function as the compensating parameter.

2. The exposure method as claimed in claim 1, further comprising:
prior to acquiring of the exposure compensating parameter, firstly judging whether or not an exposure pattern obtained by performing exposure without use of the light valve array meets a predetermined requirement, and in case of not meeting, then acquiring the exposure compensating parameter.

3. The exposure method as claimed in claim 2, wherein a control device of the exposure device adjusts a voltage of each of the light valve units of the exposure device according to a relationship between the voltage applied to the light valve units and the optical transmittance or reflectivity of the light valve units, so as to adjust the optical transmittance or reflectivity of each of the light valve units.

4. The exposure method as claimed in claim 1, wherein the compensating factor matrix $C_{ij}$ is calculated from the target critical dimension matrix $a_{target}$ and the distribution matrix $A_{ij}$ of the critical dimension by the following formula:

$$C_{ij} = \frac{a_{target}}{A_{ij}}.$$

5. The exposure method as claimed in claim 4, wherein the optical transmittance or reflectivity of a plurality of light valve units of the exposure device is adjusted according to the compensating factor matrix $C_{ij}$, and
the method further comprises:
converting the compensating factor matrix $C_{ij}$ into an optical transmittance or reflectivity matrix $T_{ij}$ of the light valve array, and adjusting the optical transmittance or reflectivity of the plurality of light valve units of the exposure device with use of the optical transmittance or reflectivity matrix $T_{ij}$.

6. The exposure method as claimed in claim 5, wherein when the light valve array is a transmissive light valve array, the compensating factor matrix $C_{ij}$ is converted into the transmittance matrix $T_{ij}$ of the light valve array by a following formula:

$$T_{ij} = \frac{C_{ij}}{t_{trans}} = \begin{pmatrix} t_{11} & \cdots & t_{i1} \\ \vdots & \ddots & \vdots \\ t_{1j} & \cdots & t_{ij} \end{pmatrix}, t_{trans} = \frac{\max(C_{ij})}{T_{max}}$$

where $T_{max}$ is maximum transmittance of the light valve units for fabricating the light valve array, $\max(C_{ij})$ is a maximum value of compensating factors; and $t_{trans}$ is a transmittance factor.

7. The exposure method as claimed in claim 5, wherein adjusting the optical transmittance or reflectivity of the plurality of light valve units of the exposure device with use of the optical transmittance or reflectivity matrix $T_{ij}$ comprises:
letting the optical transmittance or reflectivity matrix $T_{ij}$ be correspondent with the plurality of light valve units, so as to obtain a deviation of optical transmittance or reflectivity of each of the light valve units, and adjusting the optical transmittance or reflectivity of each of the light valve units based on the deviation.

8. The exposure method as claimed in claim 5, wherein a distribution matrix $A_{ij}$ of the critical dimension is inputted into a control device of the exposure device, and
the control device executes a calculation/conversion process, and adjusts voltage applied to a plurality of light valve units of the exposure device so as to adjust the optical transmittance or reflectivity of each of the light valve units.

9. The exposure method as claimed in claim 1, wherein the test pattern of critical dimension is a pattern obtained after a developing process; or
the test pattern of critical dimension is a pattern obtained after an etching process.

10. A photolithography method, comprising the exposure method as claimed in claim 1.

11. The exposure method as claimed in claim 1, wherein the optical-path assembly comprises two light paths:
a first exposure light path excluding the light valve array, and
a second exposure light path comprising the light valve array.

12. The exposure method as claimed in claim 1, wherein the optical-path assembly further comprises a first reflect mirror and a second reflect mirror,
the first reflect mirror is configured to guide the light emitted by the exposure light source to the light valve array, and
the second reflect mirror is configured to guide the light subjected to transmission or reflection of the light valve array to the exposing position.

13. The exposure method as claimed in claim 1, wherein the light valve array is a reflective light valve array or a transmissive light valve array.

14. The exposure method as claimed in claim 13, wherein the reflective light valve array comprises a micromirror array; or
the transmissive light valve array comprises an electrochromic light valve array or a liquid crystal light valve array.

15. The exposure method as claimed in claim 14, wherein an electrochromic material adopted by the electrochromic light valve array comprises $WO_3$, $MoO$, $Nb_2O_5$, $V_2O_5$, $NiO$, $IrO$ or $MnO$.

16. The exposure method as claimed in claim 1, wherein the exposure device further comprises:
a control device, configured to adjust the optical transmittance or reflectivity of each of the light valve units.

17. The exposure method as claimed in claim 16, wherein the control device is configured to adjust the optical transmittance or reflectivity of each of the light valve units by adjusting a voltage applied to each light valve unit of the light valve array.

18. The exposure method as claimed in claim 1, wherein the exposure device further comprises:
a storage device, configured to store a relationship between a voltage applied to each of the light valve units and the optical transmittance or reflectivity of each of the light valve units.

* * * * *